United States Patent [19]
Ramanathan et al.

[11] Patent Number: 5,998,997
[45] Date of Patent: Dec. 7, 1999

[54] MEASURING BONE MINERAL CHARACTERISTICS USING DIFFERENTIAL CROSS POLARIZATION AND ADIABATIC DEMAGNETIZATION IN A ROTATING FRAME WITH MAGNETIC RESONANCE

[75] Inventors: Chandrasekhar Ramanathan, Boston; Jerome L. Ackerman, Newton, both of Mass.

[73] Assignees: The General Hospital Corp., Charlestown; Massachusetts Institute of Technology, Cambridge, both of Mass.

[21] Appl. No.: 08/879,764

[22] Filed: Jun. 20, 1997

[51] Int. Cl.$^6$ .................................................. G01V 3/00
[52] U.S. Cl. ........................................ 324/309; 324/307
[58] Field of Search ................................... 324/309, 307, 324/303

[56] References Cited

U.S. PATENT DOCUMENTS

| | | | |
|---|---|---|---|
| 4,635,643 | 1/1987 | Brown | 128/653 |
| 5,247,934 | 9/1993 | Wehrli et al. | 128/653 |
| 5,345,174 | 9/1994 | Kimmich et al. | 324/309 |

OTHER PUBLICATIONS

Y. Wu, "Solid state NMR study of bone mineral," thesis, MIT, 1992, 163 pp.

Ackerman, Jerome L., Leoncio Garrido, James R. Moore, Bettina Pfleiderer and Yaotang Wu, "Fluid and Solid State MRI of Biological and Nonbiological Ceramics", Reprint from Magnetic Resonance Microscopy: Methods and Application in Materials Science, Agriculture and Biomedicine, pp. 236–260, 1992.

Ackerman, Jerome L., Daniel P. Raleigh and Melvin J. Glimcher, "Phosphorus–31 Magnetic Resonance Imaging of Hydroxyapatite: A Model for Bone Imaging", Magnetic Resonance in Medicine, vol. 25, pp. 1–11, 1992.

Moore, James. R., Leoncio Garrido and Jerome L. Ackerman, "Magnetic Resonance Imaging of Specific Chemical Constituents in Ceramic Powders and Dense Bodies", Reprint from Ceramic Engineering Science Proceedings, vol. 11, No. 9–10, pp. 1302–1319, 1990.

Moore, James R., Leoncio Garrido and Jerome L. Ackerman, "Solid State Phosphorus–31 Magnetic Resonance Imaging of Bone Mineral", Magnetic Resonance in Medicine, vol. 33, pp. 293–299, 1995.

Ramanthan, Chandrasekhar and Jerome L. Ackerman, "ADRF Cross Polarization Techniques", Abstract from 38th Experimental NMR Conference, Orlando, FL, Mar. 23–27, 1997.

Ramanathan, Chandrasekhar and Jerome L. Ackerman, "Creation of Dipolar Order", Abstract from 37th Experimental NMR Conference, Pacific Grove, CA, Mar. 17–22, 1996.

(List continued on next page.)

*Primary Examiner*—Christine K Oda
*Assistant Examiner*—Tiffany A. Fetzner
*Attorney, Agent, or Firm*—Wolf, Greenfield & Sacks, P.C.

[57] ABSTRACT

Methods and apparatus for characterizing bone mineral characteristics using differential cross polarization magnetic resonance methods are disclosed. According to one embodiment the method includes a step of producing a static magnetic field in a sample that includes first and second spin species where the second spin species has an unknown property. The method also includes a step of producing a state of dipolar order in spins of the first species in the sample. In addition, the method includes providing an RF field in the sample that is resonant with spins of the second species and then shifting the RF field by 180°. Then a signal representative of the unknown property of the second species in the sample may be acquired. Apparatus for performing the above method are also disclosed.

23 Claims, 8 Drawing Sheets

OTHER PUBLICATIONS

Ramanathan, C. and J. L. Ackerman, "Dipolar Local Field Measurements In Calcium Phosphates and Bone", Abstract from International Society for Magnetic Resonance In Medicine Fifth Scientific Meeting, Vancouver, B.C., Canada, Apr. 12–18, 1997.

Ramanathan, Chandrasekhar, Bettina Pfleiderer, Yaotang Wu, Martin J. Lizak and Jerome L. Ackerman, "ADRF–Cross Polarization Surface Coil Spectroscopy", Abstract from 36th Experimental NMR Conference, Boston, MA, Mar. 26–30, 1995.

Ramanathan, Chandrasekhar, Yaotang Wu, Bettina Pfleiderer, Martin J. Lizak, Leoncio Garrido and Jerome L. Ackerman, "ADRF–CP Surface–Coil Spectroscopy of Synthetic Calcium Phosphates and Bone Mineral", Journal of Magnetic Resonance, Series A 121, pp. 127–138, 1996.

Ramanathan, C., Y. Wu, B. Pfleiderer, M. Lizak and J. L. Ackerman, "Low Power Solid State Spectroscopy of Bone Mineral", Society of Magnetic Resonance, Nice, France, Aug. 19–25, 1995.

Wu. Yaotang, Melvin J. Glimcher, Christian Rey and Jerome L. Ackerman, "A Unique Protonated Phosphate Group in Bone Mineral Not Present in Synthetic Clacium Phosphates", Journal of Molecular Biology, vol. 244, pp. 423–435, 1994.

MEASURING BONE MINERAL CHARACTERISTICS USING DIFFERENTIAL CROSS POLARIZATION AND ADIABATIC DEMAGNETIZATION IN A ROTATING FRAME WITH MAGNETIC RESONANCE

GOVERNMENT SUPPORT

This invention was funded in part by National Institutes of Health grant AR42258 from the National Institute of Arthritis and Musculoskeletal and Skin Diseases. The Government accordingly has certain rights in the invention.

FIELD OF THE INVENTION

This application relates to magnetic resonance methods and apparatus, and more particularly to methods and apparatus for measuring bone mineral characteristics using differential cross polarization magnetic resonance methods.

BACKGROUND OF THE INVENTION

Bone mineral is composed primarily of a poorly crystalline nonstoichiometric apatite similar to hydroxyapatite, but also contains $HPO_4^{2-}$ and $CO_3^{2-}$ as well as a variety of cations. For example, it is known that $HPO_4^{2-}$ ion concentrations are the highest in newly deposited bone and that their relative concentration decreases as the mineral matures. Thus the ability to distinguish between $PO_4^{3-}$ and $HPO_4^{2-}$ in vivo is of great biochemical interest because of its potential application to diagnosis and treatment of conditions such as osteoporosis, Paget's disease, and bone defects including fractures, grafts, and tumor resections. Other applications include the study of the resorption and remodeling of calcium phosphate-based bone cements and implants.

A Magnetic Resonance (MR) spectral editing technique proposed by Melchior is a spectrally selective solid state technique that has been used to resolve overlapping spectra in heterogenous, multicomponent polymer systems and organic compounds. It discriminates between species with overlapping spectra on the basis of their cross polarization times and allows selective resonances to be nulled. The technique has been variously called inversion recovery cross polarization (IRCP), cross polarization with polarization inversion (CPPI), differential cross polarization (DCP), and cross polarization—depolarization (CPD) in the literature. Wu et al. were able to use a DCP technique to suppress the dominant phosphate group and hence detect and identify a unique protonated phosphate present in bone mineral ex vivo.

Prior art DCP techniques have typically required the simultaneous irradiation of the sample at the resonance frequencies of the two nuclei with the magnitudes of both these fields much larger than the local dipole-dipole fields in the sample. These large fields can be difficult to generate over a large volume, and can present problems when applied to lossy samples such as biological tissues, as the RF power absorption scales with the square of the RF field amplitude and can produce tissue heating.

SUMMARY OF THE INVENTION

In one general aspect, the invention features a magnetic resonance method that includes producing a state of dipolar order in spins of a first species and, providing an RF field that is resonant with spins of a second species. The phase of the RF field is then shifted by 180°, and a signal representative of a property of the second species is acquired.

In preferred embodiments, the RF field can be provided in the form of a rectangular pulse; the amplitude of the RF field in the sample can be increased to adiabatically remagnetize the second species; the step of producing a state of dipolar order can include the steps of spin locking the spins of the first species in the sample with a spin lock RF field and adiabatically reducing the spin lock field resulting in adiabatic demagnetization of the first spin species to produce the state of dipolar order; the step of producing a state of dipolar order can include providing a Jeener-Broekaert pulse pair; the steps of producing a state of dipolar order, providing a field, and shifting the phase of the field can employ a surface coil surrounding a portion of the sample; the steps of producing a state of dipolar order, providing a field, and shifting the phase of the field can be performed with the second species comprising $^{31}P$ in differing phosphate ions in the sample; the steps of producing a state of dipolar order, providing a field, and shifting the phase of the field can be performed in vivo; the steps of producing a state of dipolar order, providing a field, and shifting the phase of the field can be performed to detect a property of an artificial phosphate in bone; the steps of producing a state of dipolar order, providing a field, and shifting the phase of the field can be performed for bone mineral; the steps of producing a state of dipolar order, providing a field, and shifting the phase of the field can be performed for a human patient; the step of producing a state of dipolar order and the step of providing a field need not overlap in time; the method can also include applying gradient fields and repeating the steps of producing a state of dipolar order, providing a field, shifting the phase of the field, and acquiring, in order to acquire an image of a portion of the sample.

In another general aspect, the invention features a magnetic resonance apparatus kit for use with a magnetic resonance apparatus having a static field magnet and RF driving and detecting circuitry. The kit includes means for causing the driving circuitry to produce a state of dipolar order in spins of a first species, means for causing the driving circuitry to provide an RF field in the sample that is resonant with spins of a second species, means for causing the driving circuitry to shift the phase of the RF field by 180°, and means for causing the detecting circuitry to acquire a signal representative of an unknown property of the second species. The kit can also include a surface RF coil for connection to the driving circuitry.

In a further general aspect, the invention features a magnetic resonance apparatus that includes a static field magnet, RF driving and detecting circuitry, and an RF coil, such as a surface coil, responsive to the RF driving and detecting circuitry. The apparatus also includes means for causing the driving circuitry to produce a state of dipolar order in spins of a first species in the sample, means for causing the driving circuitry to provide an RF field in the sample that is resonant with spins of a second species in the sample, means for causing the RF driving circuitry to shift the phase of the RF field by 180°, and means for causing the detecting circuitry to acquire a signal representative of an unknown property of the second species. The magnetic resonance apparatus can also include gradient coils.

Methods and apparatus according to the invention can provide chemical contrast under conditions of low spectral resolution and low RF power deposition. These characteristics make such techniques particularly well suited to in vivo measurement of bone mineral characteristics.

DETAILED DESCRIPTION OF AN ILLUSTRATIVE EMBODIMENT

Figure 1:
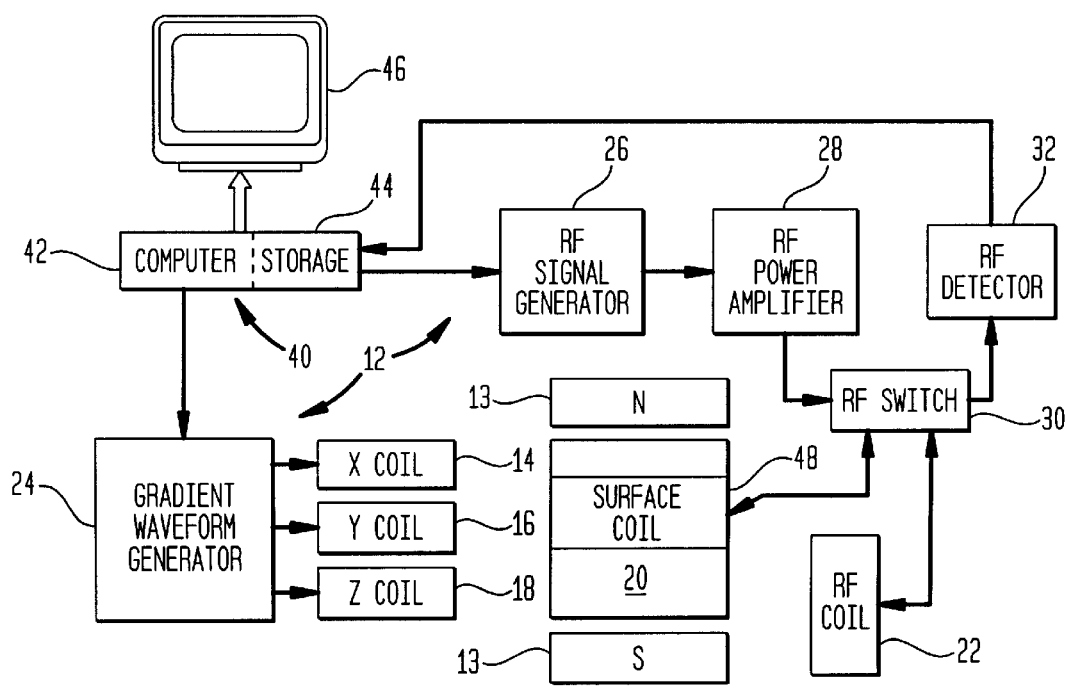
FIG. 1 is a high level block diagram of an illustrative embodiment of a magnetic resonance imaging system according to the invention.

Referring to FIG. 1, an illustrative magnetic resonance imaging system 10 generally includes a magnet assembly 13, interface circuitry 12, and a computer 40. The magnet assembly includes a very strong static field magnet 13 that creates a homogeneous magnetic field within and around a sample (e.g., an inert sample or patient) 20. Optional X, Y, and Z magnetic field gradient coils 14, 16, and 18 also form a part of the assembly and are positioned proximate or surrounding the sample 20. The assembly further comprises one or more main RF coils 22, which are positioned near or around the sample.

The system can also includes a surface coil 48 instead of or in addition to the main coil 22. The surface coil is generally smaller than the main RF coil or coils 22 and is positioned inside a volume of the magnet assembly to obtain a spectrum or an image of part of a sample or patient. Although other designs are known in the art, the surface coil is typically made up of a single loop of wire. Its purpose is to provide increased RF power in part of a sample without increasing the overall RF power delivered to the sample and to increase detection sensitivity.

The interface circuitry includes an optional gradient waveform generator 24 that has signal outputs connected to the gradient coils 14, 16, and 18, and a control input connected to the computer 40. An RF signal generator 26 also has a control input connected to the computer, and an output connected to an input of an RF power amplifier 28. The RF power amplifier has an output connected to an input of an RF switch 30. The RF switch can be connected to either the main RF or surface coils 22 and 48, and has an output connected to the input of an RF detector 32.

The computer 40 includes computing hardware 42 and storage 44. The computing hardware can comprise special purpose hard-wired computing circuitry dedicated to MR acquisition and/or imaging, a specially programmed general purpose computer, or a combination of both. The storage can include various types of storage, such as disk storage and random access memory. The storage can be used to store data and programs, including the programs used to interact with the system's interface circuitry 12. The computer has a video output for providing video signals to a display 46, as well as control outputs connected respectively to control inputs of the gradient waveform generator 24 and the RF signal generator 26. The computer also has an acquisition input operatively connected to an output of the RF detector 32.

Figure 2:
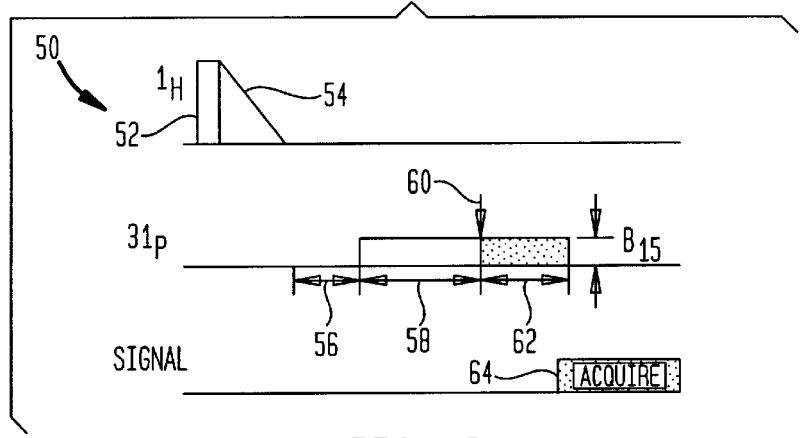
FIG. 2 is an MR pulse sequence diagram for the embodiment of FIG. 1 using an RF step to remagnetize phosphorus.

In operation, referring to FIGS. 1 and 2, the surface coil 48 is wrapped around a portion of the sample 20, and the sample is placed in the bore of the static field magnet 13. Special-purpose software within the computer 40 causes the RF signal generator 26 to generate an MR pulse sequence 50. This pulse sequence is provided to the RF switch 30, which preferably provides it to the surface coil 48.

In the description of the pulse sequence which follows, we will use protons ($^1$H or hydrogen-1 nuclei) as an example for the first spin species, and phosphorus (31P nuclei) as an example for the second spin species. This choice of spin species is preferred for characterizing bone mineral by means of the invention. However, the choice of any suitable nuclei for the first and second spin species falls within the scope of the invention. The sequence begins with an initial proton pulse 52. The initial pulse is followed by a 90° phase shifted spinlocking RF field 54 which is ramped down to zero amplitude, which adiabatically demagnetizes the protons to produce a state of high dipolar order in the protons. Although the ramp shown in FIG. 2 is linear, the amplitude of the RF does not have to decrease linearly.

After a short interval 56 during which both RF fields are off, a phosphorus RF step pulse is applied (rectangular pulse 58). The phosphorus RF field should be resonant with the phosphorus, i.e., it should be at or near the resonance frequency of phosphorus. After a short period, the RF phase is shifted by 180° (time point 60), and the field is left on for another short period 62. Finally, the RF is turned off, and the resulting signal 64 is acquired from the surface coil 48 through the RF switch 30. The RF detector detects the acquired signal and provides it to the computer 40 for processing and display.

Figure 3:
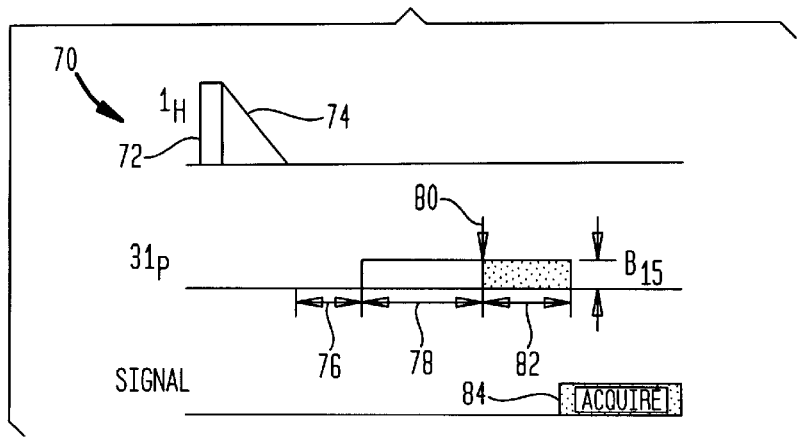
FIG. 3 is an MR pulse sequence diagram for the embodiment of FIG. 1 using an RF ramp to remagnetize phosphorus.

Referring to FIGS. 1 and 3, magnetic resonance system 10 can also adiabatically remagnetize the phosphorus spins. This alternative sequence 70 also begins with a proton pulse 72 by followed a ramp 74 to demagnetize the protons. After a short interval 76 during which neither field is on, a slow phosphorus RF ramp 78 is applied to adiabatically remagnetize the phosphorus spins. Although the ramp shown in FIG. 3 is linear, the amplitude of the RF power does not have to increase linearly. After the remagnetization, the phase of the RF is shifted by 180° (time point 80) and the RF field is left on for a short period 82. The RF field is then turned off, and the resulting signal 84 is acquired from the surface coil through the RF switch 30. The RF detector 32 detects the acquired signal and provides it to the computer 40 for processing and display.

The two pulse sequences described above can be used to determine a property of the second spin species. As described above, these sequences include detecting the signal of the second spin species. However, it is also within the scope of the invention to detect the signal of the first spin species for the purpose of determining a property of the second spin species. The detected property can be chemical identity, concentration, or any other property that can be determined from the signal received from the sample, and the property may be derived from the spectral amplitude, spectral line shape, spectral shifting, relaxation time or other attributes of the MR signal. The two sequences can be particularly useful in attempting to selectively detect $HPO_4^{2-}$ while suppressing $PO_4^{3-}$ in bone. The sequences can also be useful in detecting properties of an artificial phosphate in bone, such as phosphate deposited by pharmaceutical intervention, or surgically implanted phosphate.

In one embodiment, the acquisition is performed with one of the two sequences described above using a commercial spectroscopic MR imaging system having a 4.7 T 30 cm horizontal bore magnet. Specially developed software modules are used to drive the MR imaging system and a single-loop surface coil is placed around part of the sample within the static field magnet. For human in vivo measurements a commercially available, medical MR imaging system can be used. Because the driving electronics and/or system software of such clinical MR systems are not generally designed for measuring MR signals with short $T_2$ relaxation times, the driving and detecting electronics of a research or spectroscopic MR system can be cabled to excite the coils of and detect the signal from a sample and coils placed within the magnet of the clinical MR system. The gradient coils in the systems can be left unexcited, or they be used to obtain images of the sample, using a combination of the technique described herein and known imaging methods, such as projection reconstruction.

One imaging method employing techniques according to the invention may be obtained by substituting either of the two sequences described above in place of the cross polarization portion of the repeating sequence in the method described in J. L. Ackerman et al., Phosphorus-31 Magnetic Resonance Imaging of Hydroxyapatite: A Model for Bone Imaging, Magnetic Resonance in Medicine, vol. 25, pp. 1–11 (1992), which is herein incorporated by reference. While such an imaging technique should be well suited for measurements made of inanimate objects, care must be taken to limit power dissipation when making measurements in vivo. This type of imaging method may be best suited for smaller biological structures such as the human wrist.

The principles of the invention will now be described in more detail. To begin this discussion, it is important to understand the ADRF-CP (adiabatic demagnetization in the rotating frame-cross polarization) technique. The ADRF-CP technique was proposed by Anderson et al. in E. G. Anderson and S. R. Hartman, Phys. Review, Vol. 128, pg. 2023–2041 (1962), but has been used infrequently since then. ADRF-CP has been applied to the study of different calcium phosphates and bone, as described in Y. Wu, Solid State Study of Bone Mineral, MIT Ph.D. Thesis (1992), and in ADRF-CP Surface Coil Spectroscopy of Synthetic Calcium Phosphates and Bone Mineral, Journal of Magnetic Resonance, Series A 121, pp. 127–138 (published August 1996). These minerals are somewhat different from substances most often studied with cross-polarization as both spin species are comparably abundant.

In the mathematical description of the theory of ADRF-CP which follows, it is convenient to use the algebraic notation I for the first spin species, and S for the second spin species. This is consistent with descriptions of the prior art in the scientific literature.

Consider a sample containing $N_I$ and $N_S$ spins of two dissimilar spin-½ systems I and S with gyromagnetic ratios $\gamma_I$ and $\gamma_S$, respectively, in an external magnetic field $B_0$. Neglecting the spin-lattice and chemical shift interactions, the spin-Hamiltonian of this system is given by: (See D. Wolf, "Spin-Temperature and Nuclear-Spin Relaxation in Matter: Basic Principles and Applications," Clarendon Press, Oxford, 1979.)

$$H = H_I + H_S + H_{DIS}^{RL} + H_{RF}, \qquad (1)$$

$$H_S = H_{ZS} + H_{DSS}^{RL},$$

where $$H_{RF} = -2\gamma_I B_{1I} \cos(\omega_I t) I_x - 2\gamma_S B_{1I} \cos(\omega_S t) S_x,$$

$$H_I = H_{ZI} + H_{DII}^{RL},$$

$H_{ZI}$ is the Ispin Zeeman interaction,
$H_{DII}^{RL}$ is the rigid-lattice contribution to the homonuclear I-spin dipolar interaction, $H_{ZS}$ and $H_{DSS}{}^{RL}$ denote the corresponding S-spin interactions, $H_{DIS}{}^{RL}$ is the rigid-lattice I-S dipolar interaction, and $H_{RF}$ is the interaction of the applied RF with the spins. Letting $\omega_{0I}=\gamma_I B_0$, $\omega_{0S}=\gamma_S B_0$, $\omega_{1I}=\gamma_I B_{1I}$, and $\omega_{1S}=\gamma B_{1S}$, and transforming the resulting Hamiltonian to the tilted rotating frame (TR frame), the Hamiltonian of the spin system can be written as $$H^\rho = -\omega_{eI} I_{zP} - \omega_{eS} S_{zP} + H_{DII}{}^{\rho RL} + H_{DSS}{}^{\rho RL} + H_{DIS}{}^{\rho RL}, \quad (2)$$

where $$\omega_{eI} = \{\omega_{1I}{}^2 + (\omega_I - \omega_{0I})^2\}^{1/2} \quad (3)$$

$$\omega_{eS} = \{\omega_{1S}{}^2 + (\omega_S - \omega_{0S})^2\}^{1/2} \quad (4)$$

The total time-independent dipolar Hamiltonian in the TR frame is derived only from the secular contributions in the laboratory frame. Assuming that the different dipolar terms are strongly coupled to each other, a reasonable assumption given their dense, overlapping spectral distributions (valid for abundant I and S spins), the total dipolar local field in the TR frame is $$B_{L\rho}^2 = \frac{Tr\{(H_{DII}^{\rho RL})^2 + (H_{DSS}^{\rho RL})^2 + (H_{DIS}^{\rho RL})^2\}}{\hbar^2\{\gamma_I^2 Tr(I_{z\rho}^2) + \gamma_S^2 Tr(S_{z\rho}^2)\}} \quad (5)$$

$$= (B_{LII}^\rho)^2 + (B_{LSS}^\rho)^2 + (B_{LIS}^\rho)^2. \quad (6)$$

In the ADRF cross polarization process the spin system is initially prepared in a state of dipolar order, produced using either an ADRF technique (see A. G. Anderson and S. R. Hartmann, Phy. Rev. 128, 2023–2041 (1962) and C. P. Slichter and W. C. Holton, Phys. Rev. 122, 1701–1708 (1961)) or a Jeener-Broekaert pulse pair (see J. Jeener and P. Broekaert, Phys. Rev. 157, 232–240 (1967)). A state of dipolar order is one in which the dipolar order exceeds the order normally present given the temperature of the sample. This polarization along the local field can be transferred into an observable Zeeman polarization of the S spins by the application of a resonant RF field. If the S-spin RF field is applied suddenly, there is an initial oscillatory exchange of magnetization between the two spin systems after which thermal mixing takes place between the dipolar and Zeeman reservoirs and their temperatures equalize. The RF field can also be increased adiabatically from zero so that the two reservoirs are always in equilibrium, their temperatures being equal at all times.

The ADRF technique used in the invention is modified to yield a form of differential cross polarization, which is performed by instantaneously inverting the temperature of one of the spin systems during the cross polarization process. The sudden disequilibrium and subsequent evolution of the spins towards a common spin temperature may cause the magnetization of the S spins to pass through zero. The time at which this zero-crossing occurs will be different for species with different cross polarization times $T_{IS}$. As the cross polarization is mediated by the dipolar coupling between the nuclei, the technique is sensitive to the local ordering of the nuclear species. In conventional spin-lock cross polarization the temperature inversion is produced either by applying a hard 180 degree pulse or, more usually, by shifting the phase of either the I or S-spin RF by 180 degrees. When this is done rapidly, the "sudden approximation" of quantum mechanics applies. The populations of the spin states do not change, but the spins that were spin-locked parallel to the $B_1$ field will now be spin-locked anti-parallel to the field, resulting in an instantaneous change in the spin temperature of that system from $\theta$ to $-\theta$.

As ADRF cross polarization proceeds, the S-spin Zeeman and the dipolar temperatures approach a common value $\theta_C$. If the phase of the S-spin RF is shifted by 180 degrees, the S-spin polarization will now be anti-parallel to the Zeeman field, and the S-spin Zeeman temperature changed instantaneously from $\theta_S$ to $\theta_S$. It should be noted that in the case of ADRF-CP the temperature inversion can only be performed on the S spins as the symmetry between the I- and S-spin systems has been broken. The I spins are aligned along the local dipolar fields and not along an external RF field. The dipolar spin temperature may be inverted with a hard RF pulse, but the efficiency of this approach would be poor. An RF pulse of angle $\alpha$ applied to the dipolar system of a sample containing a single spin species will result in a change in its energy given by (see J. Jeener, H. Eisendrath, and R. Van Steewinkel, Phys. Rev. 133, A478–A490 (1964)).

$$E_{D\alpha} = E_D\left(1 - \frac{3}{2}\sin^2\alpha\right), \quad (7)$$

where $E_D$ and $E_{D\alpha}$ are the energies of the dipolar system before and after the pulse. The most negative energy is produced by a $\pi/2$ pulse resulting in a dipolar energy of $-E_D/2$. Thus if $\theta$ is the temperature of the system before the pulse, the temperature after the pulse corresponds to a temperature $-2\theta$, which represents a significant loss of polarization. The effect of the pulse becomes more complicated in multiple spin systems as the transfer efficiency depends on both the homonuclear and heteronuclear dipolar couplings.

If the phase shift is performed after equilibration of the dipolar and Zeeman reservoirs, the spin temperatures of the two systems immediately after the shift are $\theta_C$ and $-\theta_C$. Thermal mixing then takes place between the dipolar and Zeeman systems, and the final temperature of the spin system after equilibration $\theta_f$ is obtained using the conservation of energy $$\frac{(C_I + C_S)B_{L\rho}^2 - C_S B_{1S}^2}{\theta_c} = \frac{(C_I + C_S)B_{L\rho}^2 - C_S B_{1S}^2}{\theta_f} \quad (8)$$

where $C_I$ and $C_S$ are the Curie constants of the I and S spins, respectively. This leads to a final spin temperature $$\frac{1}{\theta_f} = \left(\frac{(C_I + C_S)B_{L\rho}^2 - C_S B_{1S}^2}{(C_I + C_S)B_{L\rho}^2 - C_S B_{1S}^2}\right)\frac{1}{\theta_c} \quad (9)$$

$$= \left(\frac{F^2 - B_{1S}^2}{F^2 + B_{1S}^2}\right)\frac{1}{\theta_c}, \quad (10)$$

where $$F^2 = \frac{(C_I + C_S)}{C_S}B_{L\rho}^2 = \left(1 + \frac{C_I}{C_S}\right)B_{L\rho}^2. \quad (11)$$

We call F the equivalent S-spin local field. It is the local magnetic field that the S spins must experience in order to have the same heat capacity as the total secular dipolar reservoir. F is related to $\epsilon$; the ratio of the heat capacity of the S-spin Zeeman reservoir to that of the total dipolar reservoir by $$\epsilon = B_{1S}^2/F^2.$$

The final observed magnetization after complete equilibration, phased with respect to the magnetization before the temperature inversion, is given by $$M_f = -\frac{C_S B_{1S}}{\theta_f} \quad (12)$$

$$= \frac{C_S}{\theta_C} B_{1S} \left( \frac{B_{1S}^2 - F^2}{B_{1S}^2 - F^2} \right) \quad (13)$$

$$= M_C \left( \frac{B_{1S}^2 - F^2}{B_{1S}^2 - F^2} \right) \quad (14)$$

where $$M_C = \frac{C_S B_{1S}}{\theta_C} \quad (15)$$

is the observable magnetization before the phase shift. The ratio of the final magnetization to the magnetization just before the phase shift is $$R = \frac{M_f}{M_c} = \left( \frac{B_{1S}^2 - F^2}{B_{1S}^2 + F^2} \right). \quad (16)$$

If the temperature inversion is performed after equilibration of the Zeeman and dipolar reservoirs a zero crossing of the observed magnetization should be produced only if the magnitude of the applied RF field is less than the equivalent S-spin local field. When a larger $B_{1S}$ field is applied, a zero crossing should be produced only if the phase change is performed before the Zeeman and dipolar reservoirs equilibrate. At short times after the phase of the RF is shifted, there is a transient oscillatory exchange of magnetization between the Zeeman and dipolar reservoirs. These Strombotne-Hahn oscillations occur at the effective Larmor frequency $\omega_{eS}$ of the S-spins in the rotating frame. Transient oscillations observed in regular DCP experiments usually occur only in the presence of resolved I-S couplings (see L. Müller, A. Kumar, T. Baumann, and R. R. Ernst, Phys. Rev. Lett. 32, 1402–1406 (1974)), and their frequency depends on the magnitude of the I-S dipolar coupling.

EXAMPLES

Proton to phosphorus DCP experiments were performed on synthetic samples of hydroxyapatite and brushite ($CaHPO_4 \cdot 2H_2O$) (Aldrich Chemical Company, Inc., Milwaukee, Wis.) as well as a specimen of diaphyseal porcine tibial bone. The specimen of porcine bone was obtained abattoir, cleaned of soft tissue and allowed to dry in air, retaining its complement of protein and lipid. The experiments were conducted in an Omega CSI (formerly General Electric, now Bruker Instruments, Fremont, Calif.) NMR system equipped with an Oxford Instruments (Oxford, UK) 4.7T 30 cm horizontal bore magnet. The proton and phosphorus transmitter frequencies were set on resonance for a sample of phosphoric acid.

A 90 degree proton pulse followed by a linear ramp demagnetization of the spin lock field was used to create the dipolar ordered state. The duration of the proton 90 degree pulses, approximately 65–100 $\mu s$, was too long to be considered a hard pulse. However we were limited by the maximum available power and the relatively large sample sizes we were using. The duration of the linear demagnetization ramp used was almost identical to the duration of the 90 degree pulse. This is effectively a 45 degree pulse, thus resulting in a Jeener-Broekaert pulse pair rather than a true adiabatic demagnetization of the spins. However, we have found that this sequence results in a reproducible and relatively efficient transfer of Zeeman to dipolar order, given our experimental constraints (see C. Ramanathan and J. L. Ackerman, Abstracts of the 37th Annual Experimental NMR Conference, March 17–22, Pacific Grove, Calif. (1996)).

After a short interval during which both RF fields were off, the phosphorus RF was turned on. An eight-step phase cycle, with spin-temperature alternation, was used to remove the nutation signal due to the $^{31}P$ RF and detect the CP signal. No proton decoupling was used during signal acquisition.

In the first series of experiments the phosphorus RF was suddenly turned on to initiate cross polarization. Differential cross polarization was performed by shifting the phase of the $^{31}P$ RF by 180 degrees to invert the temperature of the phosphorus spins as illustrated in FIG. 2. Experiments were performed on samples of hydroxyapatite, brushite, and bone under the conditions shown in Table 1. Each spectrum obtained represents a unique combination of forward and reverse cross polarization times.

TABLE 1

Experimental Conditions for Step ADRF-DCP Spectra

|  | Synthetic calcium phosphates | Bone specimen |
|---|---|---|
| Number of acquisitions | 64 | 128 |
| $^1H$ 90° pulse | 64 $\mu s$ | 64 $\mu s$ |
| Demagnetization ramp time | 80 $\mu s$ | 80 $\mu s$ |
| Dipolar time | 300 $\mu s$ | 300 $\mu s$ |
| Recycle time | 2 s | 1.7 s |

In the second series of experiments, a slow RF ramp was used to adiabatically remagnetize the phosphorus spins, following the ADRF of the protons. After the remagnetization, the phase of the RF was shifted by 180 degrees and the evolution of the spin system observed. Spectra were collected for varying reverse cross polarization times ranging from zero to 10 ms, and different $B_{1S}$ field strengths. The pulse sequence shown in FIG. 3 was used and the experimental parameters are given in Table 2. The experiment was performed on samples of hydroxyapatite and brushite. The duration of the remagnetization ramp was kept fixed at 2 ms for hydroxyapatite and 1.5 ms for brushite.

TABLE 2

Experimental Conditions for Ramp ADRF-DCP Spectra

|  | Brushite | Hydroxyapatite |
|---|---|---|
| Number of acquisitions | 64 | 64 |
| $^1H$ 90° pulse | 100 $\mu s$ | 64 $\mu s$ |
| Demagnetization ramp time | 100 $\mu s$ | 80 $\mu s$ |
| Dipolar time | 100 $\mu s$ | 300 $\mu s$ |
| Remagnetization ramp time | 1.5 ms | 2.0 ms |
| Duration of constant RF before phase shift | 100 $\mu s$ | 500 $\mu s$ |
| Recycle time | 2 s | 2 s |

The step RF experiments and the hydroxyapatite ramp RF experiment were performed using a two-port double resonance $^1H$–$^{31}P$ 4.8 cm diameter single loop surface coil. A two-port double resonance $^1H$–$^{31}P$ 2.5 cm diameter 7.6-cm long cylindrical resonator was used in the brushite ramp RF experiment.

Each FID was baseline corrected and apodized with a 750 Hz exponential before being Fourier transformed. An isochromat of spins 3 kHz wide centered around the peak was integrated to calculate the signal intensity in the figures illustrating the differential cross polarization. In order to perform the curve fitting to Equation [16], the spectra were fit with a Gaussian line shape and the peak intensity recorded. The spectral processing and analysis were performed with the routines of NMR1 (formerly New Methods Research, now Tripos, St. Louis, Mo.). The curve fitting was performed using the Levenberg-Marquardt method and the Numerical Recipes C programming routines described in Press et al (see W. H. Press, S. A. Teukolsky, W. T. Vetterling, and B. P. Flannery, "Numerical Recipes in C," second ed., Cambridge Univ. Press, Cambridge, UK (1992)).

Figure 4A:
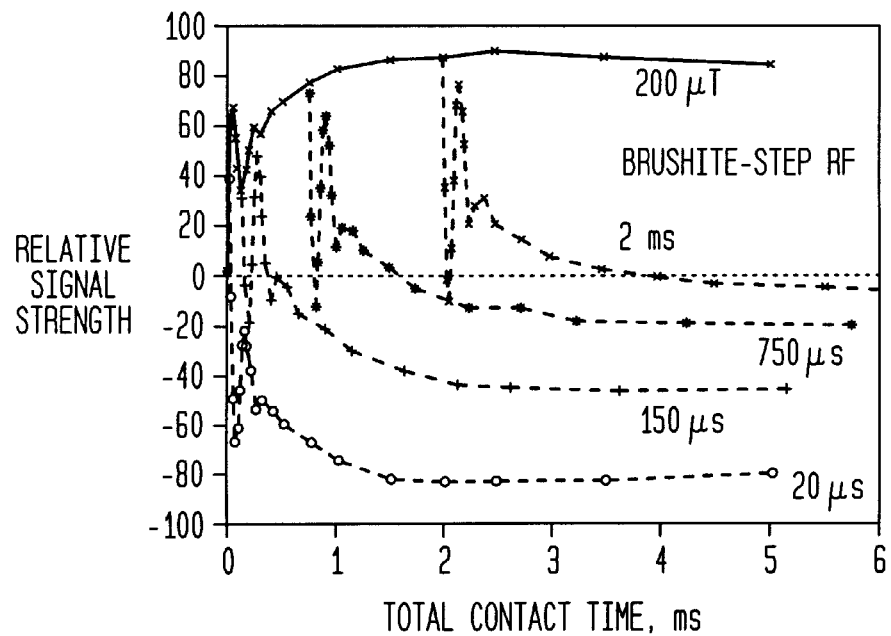
FIG. 4A is a plot of relative signal strength against total cross-polarization time for a system according to the invention, showing the effect of inverting the $^{31}$P phosphorus spin temperature at 20 µs, 150 µs, 750 µs, and 2 ms after the initiation of cross polarization in a sample of brushite, with the magnitude of the RF field at approximately 200 µT and the noise level below 0.5 units in the displayed scale.
Figure 4B:
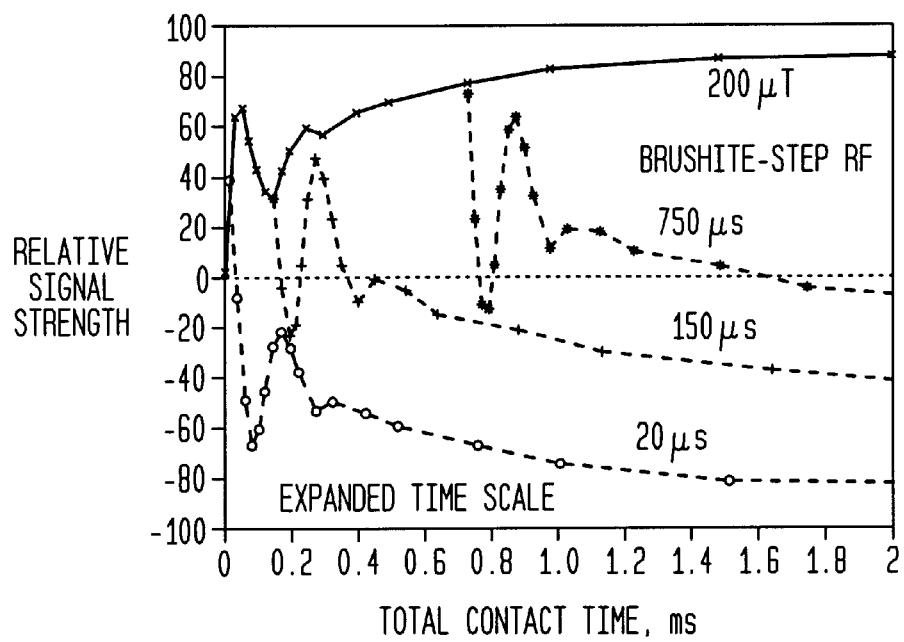
FIG. 4B presents the beginning of the plot of FIG. 4A on an expanded time scale to show the effect of inverting the phase during the transient oscillation, before the system can be described by a spin temperature.

In the first series of experiments with the step RF (FIG. 2), a number of combinations of forward and reverse cross polarization times were used to study the dynamics of the spins under this pulse sequence. The results for brushite are shown in FIGS. 4A and 4B. The usual forward cross polarization signal (solid line) is shown extending out to a contact time of 5 ms. The figure also shows the effect of inverting the $^{31}$P phase at 20 $\mu$s, 150 $\mu$s, 750 $\mu$s and 2 ms after the RF is first turned on. It was observed that the inversion of the signal is stronger if the phase is shifted early in the cross polarization process, before the $^{31}$P and $^1$H can equilibrate completely. Transient oscillations were observed immediately following the phase inversion in every experiment.

At 20 $\mu$s and 150 $\mu$s, the transient oscillations due to the sudden application of the RF field have not damped out and the system cannot be described by a spin temperature. At 750 $\mu$s and 2 ms, it appears that the spin temperature description should be valid for this spin system. When the temperature is inverted at 750 $\mu$s and 2 $\mu$s, the zero crossings were observed to occur after the new transient oscillations have decayed, at approximately 1.6 ms and 4 ms of total contact time respectively, and should be determined only by the cross polarization times. When the temperature was inverted at 2 ms, the asymptotic value of the curve was small and negative, indicating that magnitude of the $B_{1S}$ field ($\approx$200 $\mu$T) is slightly smaller than the magnitude of the equivalent S-spin local field as described by Equation [16].

Figure 5A:
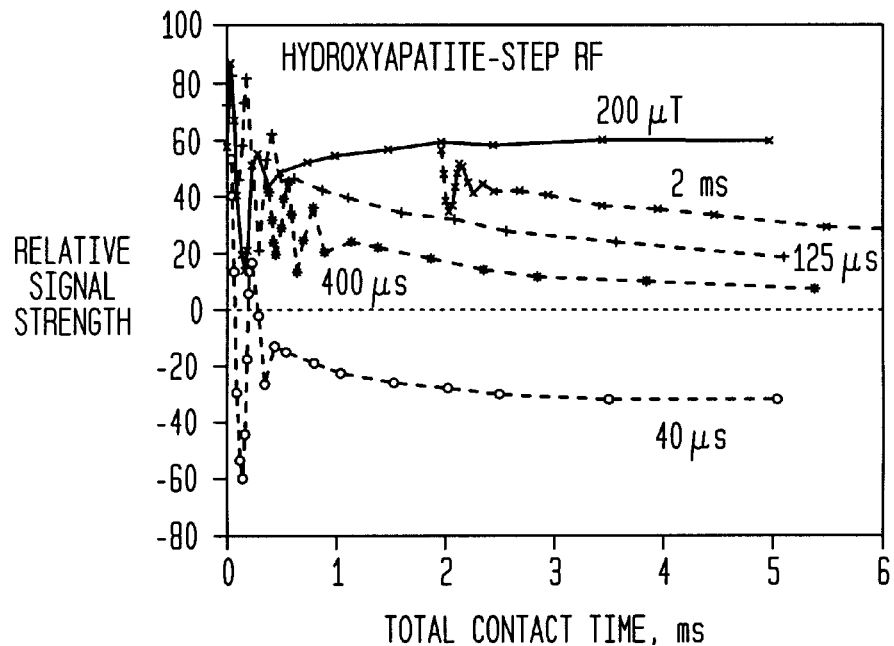
FIG. 5A is a plot of relative signal strength against total contact time for a system according to the invention showing the effect of inverting the $^{31}$P phosphorus spin temperature at 40 µs, 125 µs, 400 µs, and 2 ms after the initiation of cross polarization in a sample of hydroxyapatite, with the magnitude of the RF field at approximately 200 µT and the noise level below 0.35 units in the displayed scale.
Figure 5B:
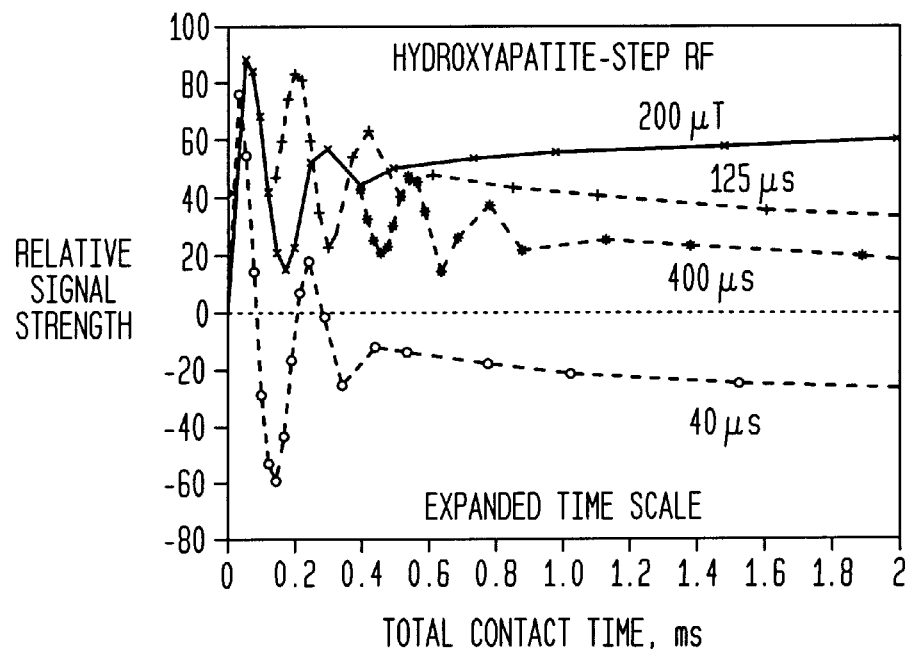
FIG. 5B presents the beginning of the plot of FIG. 5A on an expanded time scale to show the effect of inverting the phase during the transient oscillation, before the system can be described by a spin temperature.

The response of the hydroxyapatite spin system to the step RF experiment is illustrated in FIGS. 5A and 5B. It shows the effect of inverting the temperature at 40 $\mu$s, 125 $\mu$s, 400 $\mu$s and 2 ms after the RF is first turned on. Once again the inversion of the signal is stronger if the phase is shifted early in the cross polarization process before equilibration proceeds very far. The signal was observed to pass through zero only if the phase was shifted during the early part of the transient oscillation, indicating that the value of the $B_{1S}$ field ($\approx$200 $\mu$T) was greater than that of the equivalent S-spin local field. The slope of the oscillation immediately after the inversion of the phase was the negative of the slope just before the inversion, as can be seen in FIG. 5B.

Figure 6A:
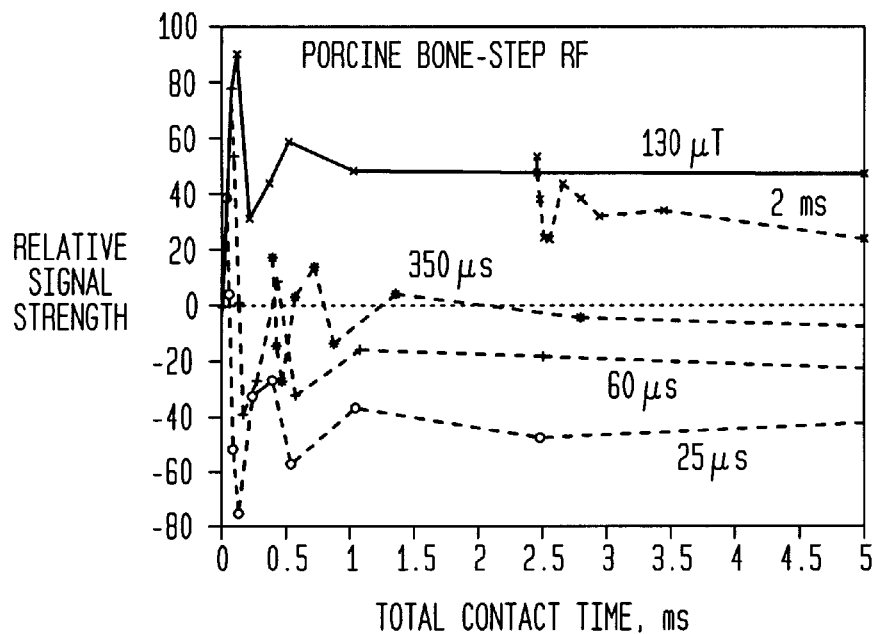
FIG. 6A is a plot of relative signal strength against total contact time for a system according to the invention showing the effect of inverting the $^{31}$P phosphorus spin temperature at various times during the cross-polarization in a bone specimen, with the RF field strength at 130 µT and the noise level below 0.8 units in the displayed scale.
Figure 6B:
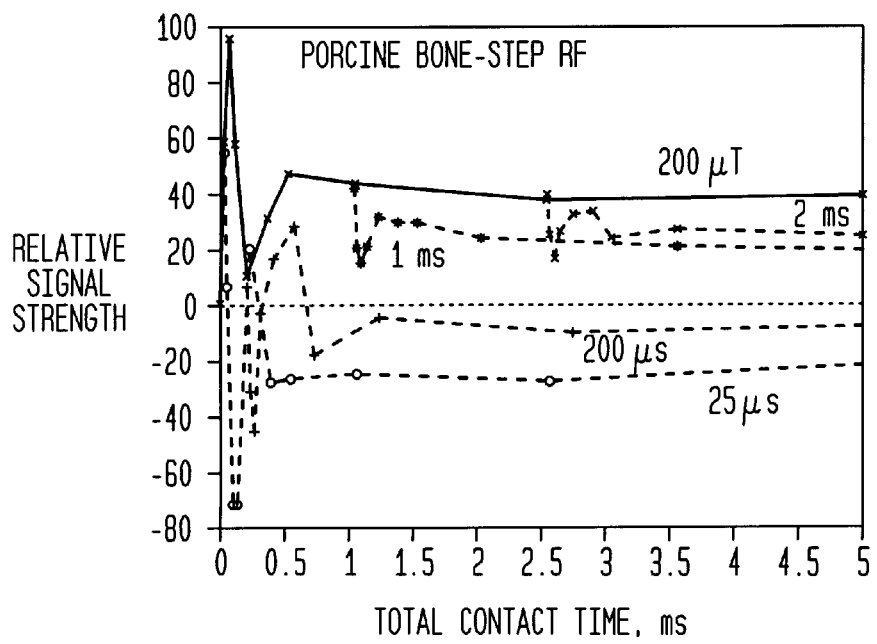
FIG. 6B is a plot similar to FIG. 6A, with the RF field strength set to 200 µT.
Figure 6C:
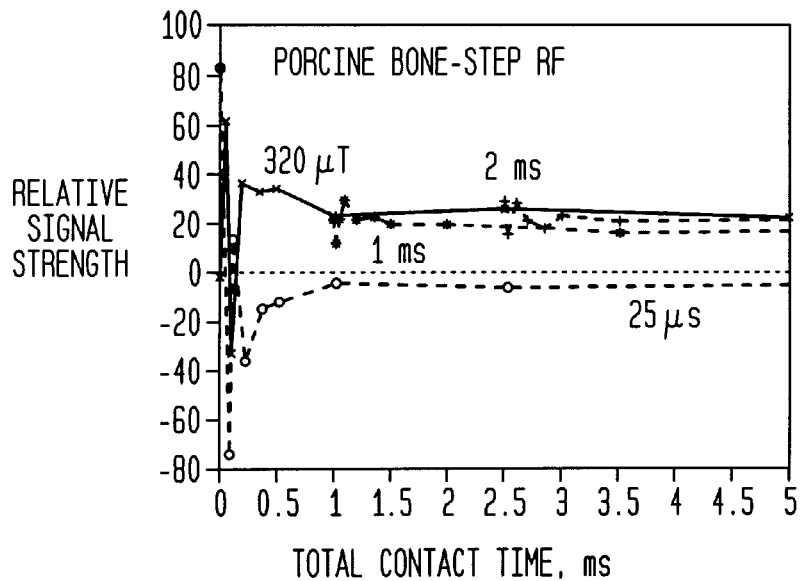
FIG. 6C is a plot similar to FIG. 6A, with the RF field strength set at 320 µT.

The response of the bone specimen to the step RF field is shown in FIGS. 6A–C for three different field intensities of 130 $\mu$T, 200 $\mu$T, and 320 $\mu$T. The strongest cross polarization took place at the lowest field. The response of the $^{31}$P spins to the temperature inversion was also the greatest in the 130 $\mu$T field, indicating strong thermal contact between the two systems. However, even the 130 $\mu$T field was larger than the equivalent S-spin local field of the bone specimen. At 320 $\mu$T there was a very small response to the phase change after the initial oscillation.

Figure 7:
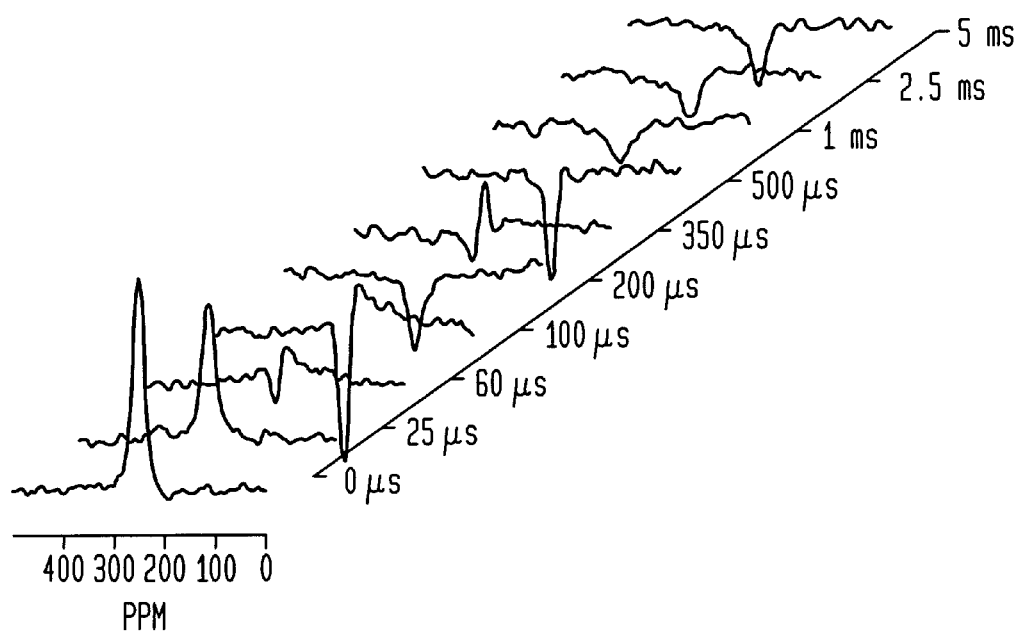
FIG. 7 is a composite spectrum of porcine bone obtained with a system according to the invention at different cross-polarization times including 0 µs, 25 µs, 60 µs, 100 µs, 200 µs, 350 µs, 500 µs, 1 ms, 2.5 ms, and 5 ms, after a forward cross-polarization time of 60 µs at an RF field strength of 130 µT.
Figure 8:
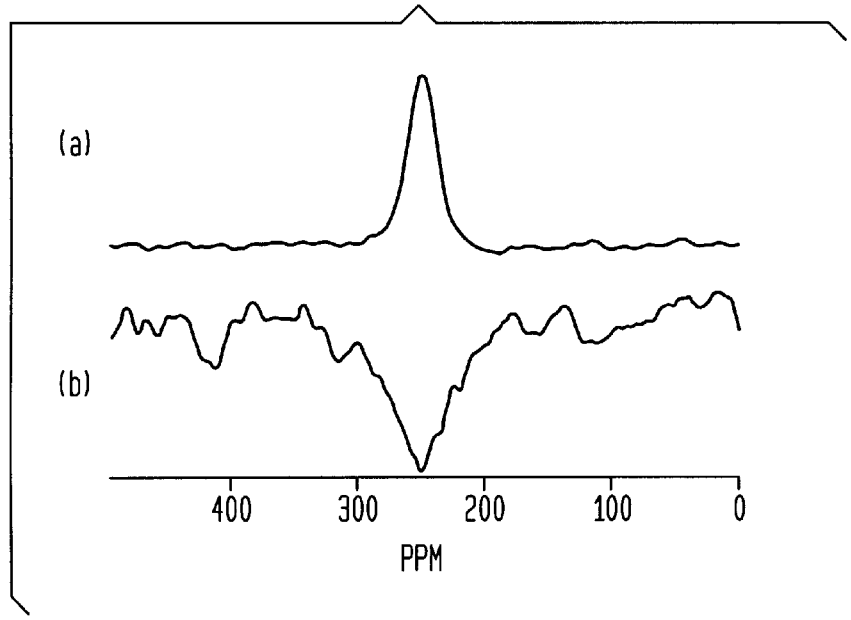
FIG. 8 is a composite spectrum of porcine bone obtained with a system according to the invention at (a) a forward cross-polarization of 60 µs, and (b) after an additional 1 ms reverse cross-polarization with the RF field strength at 130 µT; the line width with the best Gaussian fit is 2300 Hz for spectrum (a) and 4450 Hz for spectrum (b)

FIG. 7 shows the series of spectra obtained when the phase is inverted 60 $\mu$s after the RF is turned on. A strong oscillation before the asymptotic signal could be observed. Note the change in shape of the spectra at 1 ms, 2.5 ms, and 5 ms. The line widths obtained from a Gaussian curve fit to the spectra at these times are 4450 Hz, 3400 Hz, and 3000 Hz respectively. This is expected as the broader protonated spectral components cross polarize faster than the non-protonated components, and hence invert faster. The broad spectrum at a 1 ms reverse cross polarization time was indicative of the presence of $HPO_4^{2-}$ groups in the bone. FIG. 8 allows direct comparison of the spectra just before the phase shift (1 w=2300 Hz) and after 1 ms of reverse cross polarization (1 w=4450 Hz).

In the second series of experiments a linear ramp remagnetization was performed on the phosphorus spins to different maximum RF field strengths (FIG. 3). After a brief interval during which the RF was kept constant, the RF phase was shifted by 180 degrees while the magnitude was kept fixed.

Figure 9:
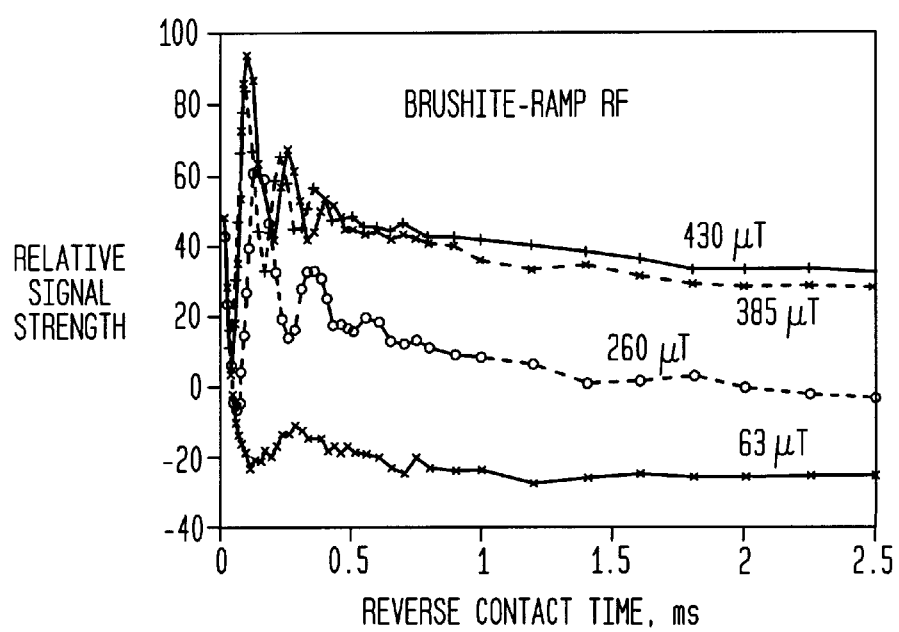
FIG. 9 is a plot of relative signal strength versus reverse contact time for a system according to the invention showing the effect of inverting the phase after an adiabatic remagnetization of the $^{31}$P spins of brushite to maximum fields of 63, 260, 385, and 430 µT, with the noise level below 0.5 units in the displayed scale.

The results obtained with brushite are shown in FIG. 9 for $B_{1S}$ field strengths of 63 $\mu$T, 260 $\mu$T, 385 $\mu$T and 430 $\mu$T. The 63 $\mu$T curve was seen to invert rapidly, while the 260 $\mu$T curve inverted much more slowly, at approximately 1.8–2 ms contact time, after the initial oscillations had decayed. The 385 $\mu$T and 430 $\mu$T curve did not change significantly after a large initial transient oscillation. The transient oscillations were observed in all cases.

Figure 10A:
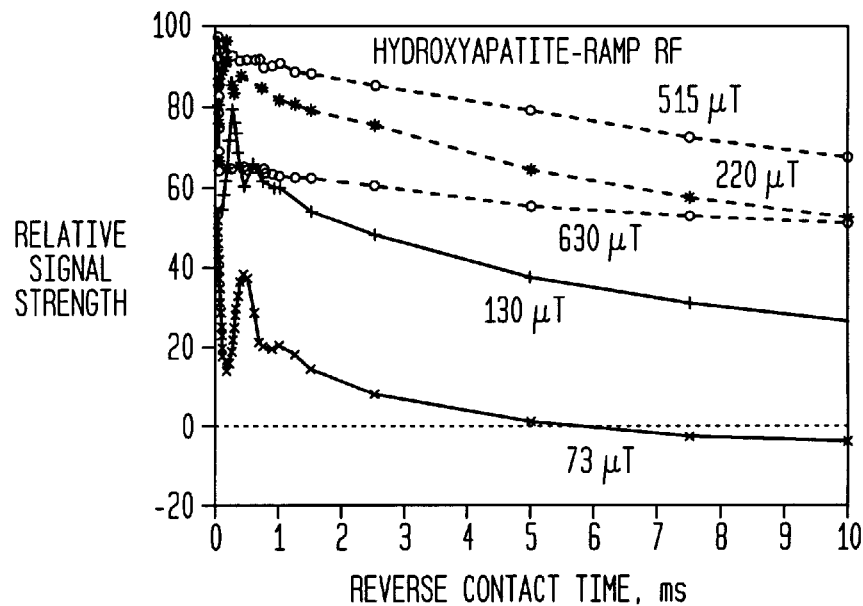
FIG. 10A is a plot of relative signal strength versus reverse contact time for a system according to the invention showing the effect of inverting the phase after an adiabatic remagnetization of the $^{31}$p spins of the hydroxyapatite to maximum fields of 73, 130, 220, 515, and 630 µT, with the noise level at less than 0.2 units in the display scale.
Figure 10B:
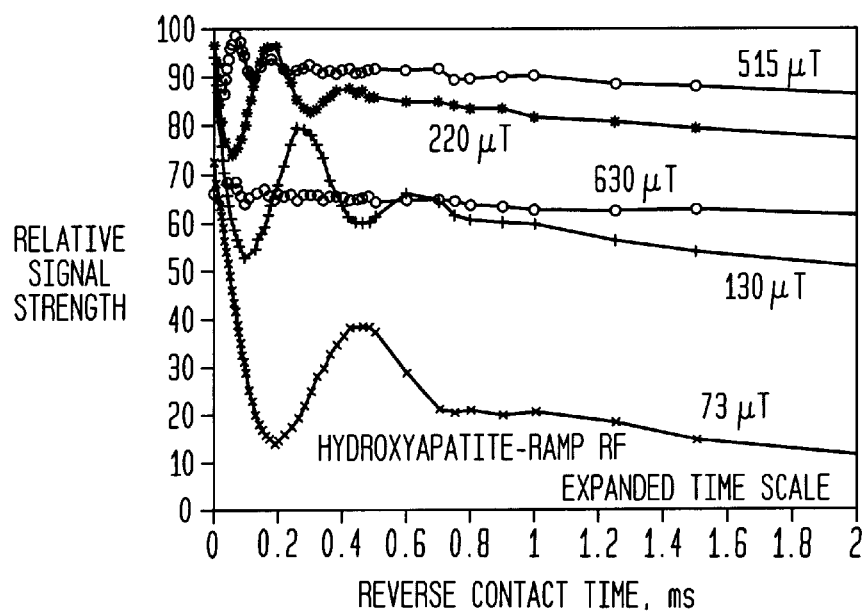
FIG. 10B shows the beginning of the plot of FIG. 10A on an expanded scale.

The results of the ramp remagnetization experiment on hydroxyapatite are shown in FIG. 10, and closely parallel those of brushite. For $B_{1S}$=73 $\mu$T there was a strong response to the change in the RF phase. The cross polarization rate was comparatively the fastest at this field and the magnetization was seen to slowly invert at approximately 6 ms of reverse cross polarization time. The 130 $\mu$T and 220 $\mu$T curves indicated some contact between the dipolar field and the Zeeman field with slower cross polarization times, while the 515 $\mu$T and 630 $\mu$T fields indicated almost no contact between the two systems. Note that the amplitude of the transient oscillation also decreased as the $B_{1S}$ field strength was increased. The small initial value of the 630 $\mu$T curve is due to the non-adiabaticity of the ramp remagnetization to this field. A slower ramp is needed in this case to achieve an adiabatic remagnetization.

Figure 11:
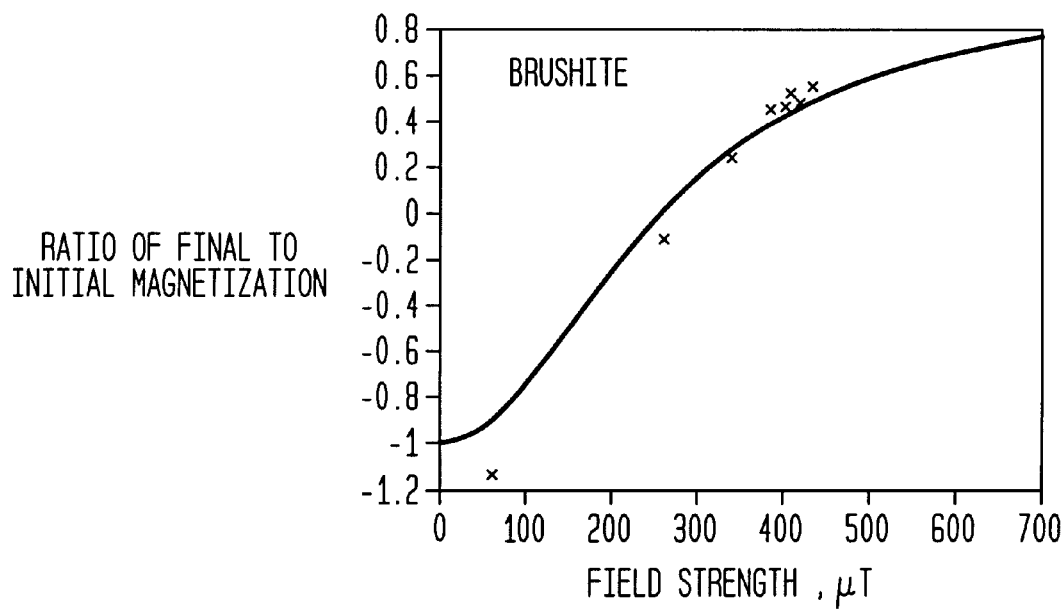
FIG. 11 is a plot of the ratio of the final magnetization (after 5 ms of reverse cross-polarization) to the initial magnetization (at the start of the reverse cross-polarization) as a function of the RF field strength for brushite, with a smooth curve showing the best fit of equation [16] to the data points, yielding an equivalent S-spin local field value of 256±13 µT.
Figure 12:
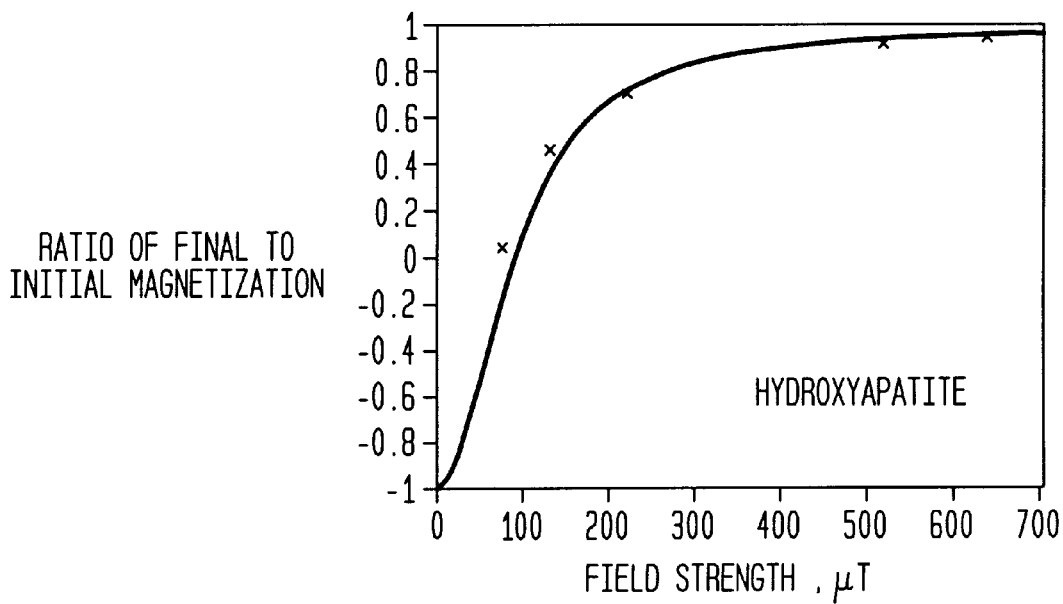
FIG. 12 is a plot of the ratio of the final magnetization (after 5 ms of reverse cross-polarization) to the initial magnetization (at the start of the reverse cross-polarization) as a function of the RF field strength for hydroxyapatite, with a smooth curve showing the best fit of equation [16] to the data points, yielding an equivalent S-spin local field value of 89±3 µT.

The ratio of the final magnetization after 5 ms of reverse cross polarization to that when the phase is changed is plotted as a fluction of $B_{1S}$ field strength in FIGS. 11 and 12. The points have been fit to the expected functional form of Equation [16] using F as the only adjustable parameter. The best fits to the brushite and hydroxyapatite data yielded equivalent S-spin local fields of 256±13 $\mu$T and 89±3 $\mu$T respectively.

The sudden disequilibrium between the $^1$H and $^{31}$P spins produced transient Strombotne-Hahn oscillations in our experiments. These oscillations occurred at the effective Larmor frequency $\omega_{eS}$ of the $^{31}$P spins, and therefore depended on the amplitude of the RF field applied. The presence of these transient oscillations made it complicated to predict the zero-crossing of the signal based on the cross polarization time $T_{IS}$ alone, as is usually done in conventional DCP experiments.

In the step RF case, only the brushite spectra in which the phase reversal was performed at 750 $\mu$s and 2 ms produced zero crossings after the initial transient oscillations had decayed. In the ramp remagnetization study, the 73 $\mu$T hydroxyapatite spectrum was observed to slowly invert at about 6 ms, and the 260 $\mu$T brushite spectrum was observed to invert at about 1.8–2 ms. In the case of the adiabatic remagnetization, the magnitude of the RF field should be smaller than the equivalent S-spin local field, otherwise no zero crossing will be observed as described by Equation [16]. If the magnitude of the RF field is too small there is no clear zero crossing as the magnetization remains negative after the oscillations have damped out. One should choose the amplitude of the RF field to be smaller than the equivalent S-spin local field, yet sufficiently large so as to ensure that the cross polarization time $T_{IS}$ which is also dependent on the RF field strength (see D. A. McArthur, E. L. Hahn, and R. E. Walstedt, Phy. Rev. 188, 609–638 (1969)), is long enough that the zero crossing occurs after the oscillations have decayed. In the case of the step RF field, the phase change should be performed only after the initial oscillations have decayed, and the phosphorus spins can be described by a spin temperature.

It is interesting to note from Equation [16] that it should also be possible to suppress one component of a multicomponent system by using an RF field whose magnitude is equal to the equivalent S-spin local field of the component to be suppressed ($B_{1S}$=F).

As long as the experiments are conducted in a time short compared to the spin-lattice relaxation times $T_{ID}$ and $T_{I\rho}$ of the sample, it is possible to perform simple calorimetry with the two spin systems. In addition, as the heat capacity of the $^{31}$P spins depends on the magnitude of the RF field, it is also possible to find the strength of the equivalent S-spin local dipolar field of the sample. We obtained equivalent S-spin local field values of 256±13 $\mu$T for brushite and 89±3 $\mu$T for hydroxyapatite. Incomplete equilibration of the spin systems before and after the temperature inversion, as well as $T_{1\rho}$ effects have been neglected in the current model. Incorporating these considerations could improve the theoretical fit to the data, though it will lead to the introduction of a number of additional parameters. It should also be possible to combine the results of these experiments with those of proton-observe experiments to calculate the effective ratio of the Curie constants of the two spins, indicating the number of proton spins in effective dipolar contact with each phosphorus spin.

The ramp remagnetization experiments show that it is possible to effectively break thermal contact between the Zeeman and dipolar reservoirs by increasing the strength of the RF sufficiently. By varying the size of the applied RF field the interaction of these reservoirs can be examined over different regimes.

As will be apparent from the preceding discussion, the presence of transient oscillations can make it difficult to select a specific set of forward and reverse cross polarization times to achieve spectral selection based on $T_{IS}$ differences. It is therefore necessary to carefully selects the magnitude of the RF field used, as well as the time at which the $^{31}$P spin temperature is inverted in order to be able to perform spectral selection. However, under specific conditions it should be possible to find an appropriate set of parameters in order to achieve a particular selectivity, if the values of $T_{IS}$ and the various $T_I$ times are sufficiently different from each other. Alternately, the ADRF-DCP technique can also be used to provide spectral selection on the basis of the equivalent S-spin local field. It is also possible to perform spin calorimetry to obtain the value of equivalent S-spin local fields.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A DCP and ADRF magnetic resonance imaging method, comprising the steps of:
   producing a static magnetic field in a sample comprising first and second spin species, the second spin species having an unknown property,
   producing a state of dipolar order in spins of the first species in the sample,
   providing an RF field in the sample that is resonant with spins of the second species in the sample,
   shifting the phase of the RF field provided in the step of providing an RF field resonant with spins of the second species by 180°, and
   acquiring a signal representative of the unknown property of the second species in the sample.

2. The method of claim 1 wherein the step of providing an RF field provides the RF field in the sample in the form of a rectangular pulse.

3. The method of claim 1 wherein the step of providing an RF field progressively increases the amplitude of the RF field in the sample to adiabatically remagnetize the second species.

4. The method of claim 1 wherein the step of producing a state of dipolar order includes the steps of spin locking the spins of the first species in the sample, and adiabatically demagnetizing a spin lock field resulting from the step of spin locking to produce the state of dipolar order.

5. The method of claim 1 wherein the step of producing a state of dipolar order includes providing a Jeener-Broekaert pulse pair.

6. The method of claim 1 wherein the step of producing a state of dipolar order includes providing an adiabatic frequency sweep onto resonance of the first spin species with an RF field having an amplitude which is small compared to the strength of the local field.

7. The method of claim 1 wherein the steps of producing a state of dipolar order, providing an RF field, and shifting the phase of the RF field employ a surface coil surrounding a portion of the sample.

8. The method of claim 1 wherein the steps of producing a state of dipolar order, providing an RF field, and shifting the phase of the RF field are performed with the second species comprising $^{31}$P in differing phosphate ions in the sample.

9. The method of claim 1 wherein the steps of producing a state of dipolar order, providing an RF field, and shifting the phase of the RF field are performed in vivo.

10. The method of claim 1 wherein the steps of producing a state of dipolar order, providing an RF field, and shifting the phase of the RF field are performed to detect a property of an artificial phosphate in bone.

11. The method of claim 1 wherein the steps of producing a state of dipolar order, providing an RF field, and shifting the phase of the RF field are performed for bone mineral.

12. The method of claim 1 wherein the steps of producing a state of dipolar order, providing an RF field, and shifting the phase of the RF field are performed for a human patient.

13. The method of claim 1 wherein the step of producing a state of dipolar order and the step of providing an RF field do not overlap in time.

14. The method of claim 1 further including the step of applying gradient fields and repeating the steps of producing a state of dipolar order, providing an RF field, shifting the phase of the RF field, and acquiring, in order to acquire an image of a portion of the sample.

15. A magnetic resonance apparatus kit for use with a magnetic resonance apparatus having a static field magnet and RF driving and detecting circuitry, comprising:

means for causing the RF driving circuitry of the magnetic resonance apparatus to produce a state of dipolar order in spins of a first species in the sample, means for causing the RF driving circuitry of the magnetic resonance apparatus to provide an RF field in the sample that is resonant with spins of a second species in the sample, means for causing the RF driving circuitry of the magnetic resonance apparatus to shift the phase of the RF field by 180°, and means for causing the RF detecting circuitry of the magnetic resonance apparatus to acquire a signal representative of an unknown property of the second species in the sample.

16. The kit of claim 15 further including a surface RF coil for connection to the RF driving circuitry.

17. The kit of claim 15 wherein the means for causing the RF driving circuitry of the magnetic resonance apparatus to produce a state of dipolar order include means for spin locking the spins of the first species in the sample, and include means for adiabatically demagnetizing a spin lock field resulting from the step of spin locking to produce the state of dipolar order.

18. The kit of claim 15 wherein the means for causing the RF driving circuitry of the magnetic resonance apparatus to produce a state of dipolar order and the means for causing the RF driving circuitry of the magnetic resonance apparatus to provide an RF field in the sample that is resonant with a second species in the sample produce RF fields that do not overlap in time.

19. A magnetic resonance apparatus, comprising:

a static field magnet,

RF driving and detecting circuitry, an RF coil responsive to the RF driving and detecting circuitry, means for causing the RF driving circuitry of the magnetic resonance apparatus to produce a state of dipolar order in spins of a first species in the sample, means for causing the RF driving circuitry of the magnetic resonance apparatus to provide an RF field in the sample that is resonant with spins of a second species in the sample, means for causing the RF driving circuitry of the magnetic resonance apparatus to shift the phase of the RF field by 180°, and means for causing the RF detecting circuitry of the magnetic resonance apparatus to acquire a signal representative of an unknown property of the second species in the sample.

20. The magnetic resonance apparatus of claim 19 wherein the RF coil is a surface coil.

21. The magnetic resonance apparatus of claim 19 further including gradient coils.

22. The magnetic resonance apparatus of claim 19 wherein the means for causing the RF driving circuitry of the magnetic resonance apparatus to produce a state of dipolar order include means for spin locking the spins of the first species in the sample, and include means for adiabatically demagnetizing a spin lock field resulting from the means for spin locking to produce the state of dipolar order.

23. The magnetic resonance apparatus of claim 19 wherein the means for causing the RF driving circuitry of the magnetic resonance apparatus to produce a state of dipolar order and the means for causing the RF driving circuitry of the magnetic resonance apparatus to provide an RF field in the sample that is resonant with a second species in the sample produce RF fields that do not overlap in time.

* * * * *